United States Patent [19]

Ohsawa

[11] 4,339,785
[45] Jul. 13, 1982

[54] ELECTRONIC CIRCUIT ARRANGEMENT MOUNTED ON PRINTED CIRCUIT BOARD

[75] Inventor: Mitsuo Ohsawa, Tokyo, Japan

[73] Assignee: Sony Corporation, Tokyo, Japan

[21] Appl. No.: 138,438

[22] Filed: Apr. 8, 1980

[30] Foreign Application Priority Data

Apr. 26, 1979 [JP] Japan ............................ 54-56331[U]

[51] Int. Cl.³ ............................................. H05K 1/18
[52] U.S. Cl. .................................... 361/411; 174/112;
361/400; 361/403; 361/409; 427/96
[58] Field of Search ............... 361/400, 403, 409, 411;
174/112, 117 A; 156/63, 830, 831; 427/96;
29/832, 833, 834

[56] References Cited

U.S. PATENT DOCUMENTS

| 2,441,960 | 5/1948 | Eisler | 174/68.5 UX |
| 3,272,909 | 9/1966 | Bruck | 714/68.5 |
| 3,410,949 | 11/1968 | Tischler | 174/112 X |
| 4,208,005 | 6/1980 | Nate | 427/96 X |

FOREIGN PATENT DOCUMENTS 1199231 7/1970 United Kingdom ............... 361/400

Primary Examiner—Richard R. Kucia
Attorney, Agent, or Firm—Hill, Van Santen, Steadman, Chiara & Simpson

[57] ABSTRACT

In an electronic circuit arrangement mounted on a printed circuit board in which leadless circuit parts are attached to the printed circuit board with adhesive. A white paint is applied onto a region to which adhesive is applied, and an adhesive containing pigment contrastable to the white paint is applied onto the paint.

7 Claims, 3 Drawing Figures

ELECTRONIC CIRCUIT ARRANGEMENT MOUNTED ON PRINTED CIRCUIT BOARD

BACKGROUND OF THE INVENTION

1. Field of the Invention

This invention relates to an electronic circuit arrangement formed on a printed circuit board, and more particularly to an electronic circuit arrangement mounted on a printed circuit board in which leadless circuit parts are provisionally attached to the printed circuit board with adhesive.

2. Description of the Prior Art

A leadless circuit part is known. In the leadless circuit part, metallic electrode caps are attached to both ends of a cylindrical material (solid or hollow). Resistors, condensers, diodes and jumpers can be manufactured in the form of leadless circuit part. The shapes and sizes of these leadless circuit parts are substantially equal to each other so that they can be mounted on a printed circuit board by the same automatic mounting machine. An electronic circuit arrangement with high integration density can be obtained by the leadless circuit parts.

In the mounting process, adhesive is applied to predetermined positions to provisionally attach leadless circuit parts. However, it is difficult to distinguish whether adhesive is applied to the predetermined positions, or not, and whether a suitable amount of adhesive is exactly applied to the predetermined positions, or not.

SUMMARY OF THE INVENTION

Accordingly, it is an object of this invention to provide an electronic circuit arrangement mounted on a printed circuit board in which it can be easily distinguished whether adhesive is applied to the predetermined position, or not.

Another object of this invention is to provide an electronic circuit arrangement mounted on a printed circuit board in which it can be easily distinguished whether a suitable amount of adhesive is exactly applied to predetermined positions, or not.

A further object of this invention is to provide an electronic circuit arrangement mounted on a printed circuit board in which leadless circuit parts are securely mounted on the printed circuit board.

A still further object of this invention is to provide an electronic circuit arrangement mounted on a printed circuit board which is reliable.

In accordance with an aspect of this invention, there is provided an electronic circuit arrangement which is mounted on a printed circuit board and has leadless circuit parts attached to the printed circuit board with adhesive, and a film of color having high luminosity is attached to the board on a region to which adhesive is applied, and adhesive containing pigment contrastable to said color is attached to said film.

Various other objects, advantages and features of the present invention will become readily apparent from the ensuing detailed description, and the novel features will be particularly pointed out in the appended claims.

DESCRIPTION OF A PREFERRED EMBODIMENT

First, one example of a leadless circuit part to which this invention is applied, will be described with reference to FIG. 1.

Figure 1:
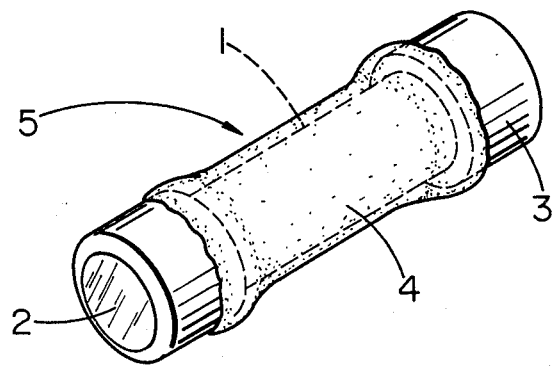
FIG. 1 is a perspective view of one example of a leadless circuit part to which this invention will be applied.

Referring to FIG. 1, metallic electrode caps 2 and 3 are fixed to both ends of a cylindrical material 1. The caps 2 and 3, and the material 1 are molded with resin 4 except respective parts of the caps 2 and 3. Thus, a leadless circuit part 5 is obtained.

Figure 2:
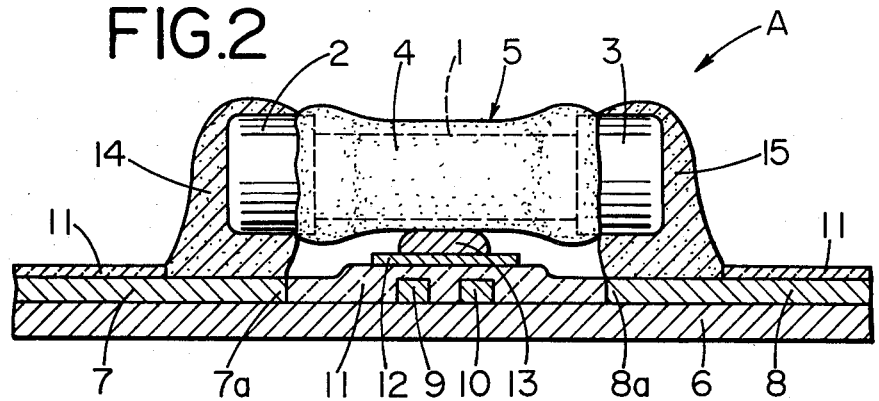
FIG. 2 is a cross-sectional view of an electronic circuit arrangement formed on a printed circuit board according to one preferred embodiment of this invention.
Figure 3:
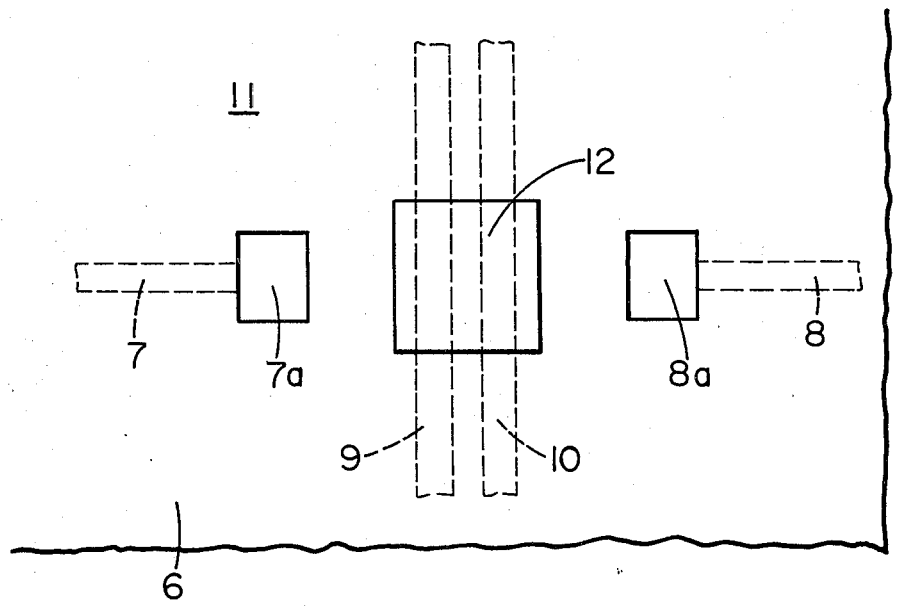
FIG. 3 is a fragmentary plan view illustrating an embodiment of a printed circuit board to which this invention is applied.

In the electronic circuit arrangement A (FIG. 2), the leadless circuit part 5 is mounted on a printed circuit board 6 in the manner shown in FIG. 2. Copper foil patterns 7 and 8 having lands 7a and 8a and cross copper foil patterns 9 and 10 to be crossed with the leadless circuit part 5 are formed on the printed circuit board 6, as clearly shown in FIG. 3. The printed circuit board 6 and the copper foil patterns 7 to 10 are covered with a solder resist film 11. The lands 7a and 8a as electrodes are exposed. An adhesive land 12 of a predetermined thickness is formed on the solder resist film 11 between the lands 7a and 8a, and it is used for provisionally attaching the leadless electronic circuit part 5. An intent to apply adhesive 13 is indicated by the adhesive land 12. For example, the adhesive land 12 can be obtained by a coating of white paint. The adhesive land 12 functions also to improve electrical insulation between the cross copper foil patterns 9 and 10, and the leadless electronic circuit part 5.

Next, there will be described the operation for mounting the leadless circuit part 5 on the printed circuit board 6.

First, the adhesive land 12 is coated with a predetermined amount of adhesive 13 by a screen-printing method. Light-hardening resin or thermo-setting resin of epoxy acrylate group is used as the adhesive 13. When light-hardening resin is used as the adhesive 13, an ultra-violet ray or electron beam is irradiated onto the adhesive 13 for several seconds to several tens of seconds to harden the adhesive 13. A usual adhesive of this sort is transparent. Accordingly, it is difficult to distinguish in a short time with naked eyes whether the adhesive land 12 is coated with adhesive, or not. Particularly, when numerous leadless circuit elements are mounted on the printed circuit board 6, numerous adhesive lands should be coated with adhesive. It is very difficult to distinguish with naked eyes whether adhesive is exactly applied to the numerous adhesive lands or not.

According to this invention, the adhesive 13 is colored to easily distinguish whether the adhesive land 12 is coated with the adhesive 13, or not. For example, pigment can be used as a coloring agent for the adhesive 13. About 1% to 5% of pigment is mixed with the adhesive 13. The adhesive 13 may be light-colored. When too much pigment is mixed with the adhesive 13, its adhesive strength is lowered. When light-hardening resin is used as the adhesive 13, a large amount of pigment lowers light-transmissivity of the adhesive 13. The adhesive land 12 is usually white or some other light color. The solder resist film 11 is dark green or some other dark color. The adhesive 13 may be so colored as to be easily distinguished from the adhesive land 12 and the solder resist film 11. For example, the adhesive is light red.

The colored adhesive 13 is applied to the adhesive land 12. The leadless circuit part 5 is mounted on the adhesive land 12 coated with the colored adhesive 13. The leadless circuit part 5 is softly pushed toward the adhesive land 13. Then, the adhesive 13 is hardened. Thus, the leadless circuit part 5 is provisionally attached to the printed circuit board 6.

The printed circuit board 6 with the attached leadless circuit part 5 is dipped into solder bath and then drawn up from the solder bath. The solder is hardened. As the result, the caps 2 and 3 are fixed to the lands 7a and 8a with solders 14 and 15. Thus, the leadless circuit part 5 is electrically and mechanically connected to the patterns 7 and 8. The electronic circuit arrangement A is obtained as shown in FIG. 2.

While there has been described a preferred embodiment of the invention, obviously further modifications and variations are possible in light of the above teachings. It is therefore to be understood that within the scope of the appended claims, the invention may be practiced otherwise than as specifically described.

I claim as my invention:

1. An electronic circuit arrangement mounted on a printed circuit board in which leadless circuit parts are attached to the printed circuit board with adhesive, the improvement in which a film of a first color having a high luminosity is attached to said printed circuit board in regions to which said adhesive is applied, and said adhesive containing pigment of a second color contrastable to said first color attached to said film, and said leadless circuit parts attached to said board by said adhesive.

2. An electronic circuit arrangement mounted on a printed circuit board according to claim 1, in which said film is white paint.

3. An electronic circuit arrangement mounted on a printed circuit board according to claim 2, in which said adhesive is light-hardening resin of epoxy-acrylate group.

4. An electronic circuit arrangement mounted on a printed circuit board according to claim 2, in which said adhesive is thermo-setting resin of epoxy-acrylate group.

5. An electronic circuit arrangement mounted on a printed circuit board according to claim 3, in which the content of said pigment in said adhesive is 1% to 5%.

6. An electronic circuit arrangement mounted on a printed circuit board according to claim 4, in which the content of said pigment in said adhesive is 1% to 5%.

7. An electronic circuit arrangement mounted on a printed circuit board according to claim 1, in which said film extends over cross patterns.

* * * * *